United States Patent
Hsieh

(10) Patent No.: US 11,777,000 B2
(45) Date of Patent: Oct. 3, 2023

(54) SIC TRENCH MOSFET WITH LOW ON-RESISTANCE AND SWITCHING LOSS

(71) Applicant: Nami MOS CO., LTD., New Taipei (TW)

(72) Inventor: Fu-Yuan Hsieh, New Taipei (TW)

(73) Assignee: NAMI MOS CO., LTD., New Taipei (TW)

( * ) Notice: Subject to any disclaimer, the term of this patent is extended or adjusted under 35 U.S.C. 154(b) by 144 days.

(21) Appl. No.: 17/321,537

(22) Filed: May 17, 2021

(65) Prior Publication Data
US 2022/0367636 A1   Nov. 17, 2022

(51) Int. Cl.
| | |
|---|---|
| *H01L 29/10* | (2006.01) |
| *H01L 29/06* | (2006.01) |
| *H01L 29/423* | (2006.01) |
| *H01L 29/78* | (2006.01) |
| *H01L 29/66* | (2006.01) |
| *H01L 29/739* | (2006.01) |
| *H01L 21/04* | (2006.01) |
| *H01L 29/16* | (2006.01) |

(52) U.S. Cl.
CPC ...... *H01L 29/1045* (2013.01); *H01L 29/0634* (2013.01); *H01L 29/42304* (2013.01); *H01L 29/42368* (2013.01); *H01L 29/66068* (2013.01); *H01L 29/7397* (2013.01); *H01L 29/7813* (2013.01); *H01L 21/0465* (2013.01); *H01L 29/0696* (2013.01); *H01L 29/1608* (2013.01)

(58) Field of Classification Search
CPC ............ H01L 29/1045; H01L 29/0634; H01L 29/42304; H01L 29/42368; H01L 29/66068; H01L 29/7397; H01L 29/7813; H01L 21/0465; H01L 29/0696; H01L 29/1608; H01L 29/0834; H01L 29/417; H01L 29/0878; H01L 29/0623; H01L 29/1095; H01L 29/41766; H01L 29/66712–66734; H01L 29/7802–7815; H01L 21/823487; H01L 29/66666; H01L 51/057; H01L 29/7812; H01L 29/7824; H01L 29/7375; H01L 29/66325; H01L 29/7828; H01L 29/78642; H01L 29/66333–66348
See application file for complete search history.

(56) References Cited

U.S. PATENT DOCUMENTS 8,841,721 B2 *   9/2014   Yen ..................... H01L 29/7828
                                                                257/330

* cited by examiner

*Primary Examiner* — Cuong B Nguyen
(74) *Attorney, Agent, or Firm* — BACON & THOMAS, PLLC

(57) ABSTRACT

An improved SiC trench MOSFET having first and second type gate trenches for formation of a gate electrode, and a grounded P-shield region under the gate electrode for gate oxide electric-field reduction is disclosed. The gate electrodes are disposed into the first type gate trench having a thick oxide layer on trench bottom. The grounded P-shield region surrounding the second type gate trench filled up with the thick oxide layer is connected with a source metal through a grounded P region. The device further comprises a current spreading region surrounding the first type gate trench for on-resistance reduction.

11 Claims, 30 Drawing Sheets

SiC TRENCH MOSFET WITH LOW ON-RESISTANCE AND SWITCHING LOSS

FIELD OF THE INVENTION

This invention relates generally to semiconductor devices, and more particularly, to a silicon carbide (SiC) trench MOSFET (Metal Oxide Semiconductor Field Effect Transistor) having a first and a second type gate trench for formation of a gate electrode and a grounded P-shield (PS) region for gate oxide electric-field reduction. The device further comprises a current spreading region surrounding the first type gate trench below body regions, to achieve a lower electric-field strength of the gate oxide, lower on-resistance, smaller gate-drain charge (Qgd) and lower switching loss.

BACKGROUND OF THE INVENTION

Because of the physical properties of SiC. SiC-MOSFETs can achieve a higher breakdown voltage, lower on-resistance and higher switching speed than Si-MOSFETs. However, SiC-MOSFETs have a higher electric-field strength at the gate oxide than Si-MOSFETs because of poor interface state between SiC and the gate oxide requiring higher Vgs to fully turn on device channel. E.g., for Si device, Vgs=10V can fully turn on the Si device channel but for SiC requires Vgs=18V. The higher Vgs causes higher electric filed strength at gate oxide resulting in reliability issue.

Another issue is gate oxide grown at trench bottom of SiC device is much thinner than trench sidewalls (about 3-5 times thinner) as shown in FIG. 1, not only causing higher Qgd but also making much higher gate oxide electric-field strength at trench bottom. The device structure in the FIG. 1 is similar to conventional Si Trench MOSFET except N+ SiC substrate 101 and SiC epitaxial layer 102, having n+ source region 111 and P body region 110. A gate trench 103 filled up with gate electrode 105 is formed in the epitaxial layer 102 having a thermally grown gate oxide 109 on trench sidewalls and a 106 on trench bottom. The gate oxide thickness of the gate oxide 106 is less than the 109 as result of oxidation rate of trench bottom on Si plane is lowest in crystal plane of SiC.

Therefore, there is still a need in the art of the semiconductor device design and fabrication, particularly for SiC trench MOSFET design and fabrication, to provide a novel cell structure, device configuration and manufacturing process that would resolve these difficulties and design limitations, making a SiC trench MOSFET has lower electric-field strength of the gate oxide, achieve lower on-resistance, smaller Qgd and lower switching loss.

SUMMARY OF THE INVENTION

The present invention discloses a SiC trench MOSFET having a first and a second type gate trench for formation of a gate electrode and a grounded P-shield (PS) region for gate oxide electric-field reduction, wherein the gate electrodes are disposed into the first type gate trenches having a thick oxide layer on trench bottom, and the grounded P-shield (PS) regions are formed surrounding the second type gate trenches filled up with the thick oxide layer, connecting with a body region through at least one grounded P (GP) region and shorted with source metal. Width of the P-shield (PS) regions can be designed narrower than first type gate trench as a result of the second type gate trench is narrower than the first type gate trench. Therefore, on resistance is reduced as a result of less pinch-off effect between the two adjacent P-shield (PS) regions. The device further comprises a current spreading region surrounding the first type gate trenches below body regions to further avoid the pinching off effect between the two adjacent P-shield (PS) regions for on-resistance reduction, wherein doping concentration of the current spreading region (Ncs) is higher than the epitaxial layer (Nepi). Because of a thicker bottom oxide layer of the device, it should be capable of achieving a smaller Qgd as well as further reductions in switching loss compared to a conventional SiC MOSFET.

According to one aspect, the invention features a SiC power device comprising a plurality of unit cells with each unit cell in an active area comprising: an epitaxial layer of a first conductivity type is onto a substrate; at least one stripe gate trench is surrounded by a source region of the first conductivity type encompassed in a body region of a second conductivity type near a top surface of the epitaxial layer; each of the stripe gate trenches has a first type gate trench and a second type gate trench; the first type gate trench is above the second type gate trench and has a trench width wider than the second type gate trench, a gate electrode is disposed in the first type gate trench surrounded with a first insulating film on bottom of the first type gate trench, and with a second insulating film on sidewalls of the first type gate trench; the first insulating film has a thickness greater than the second insulating film; a P-shield (PS) region of the second conductivity type for gate oxide electric-field reduction is surrounding with the second type gate trench filled up with the first insulating film; at least one grounded P (GP) region of the second conductivity type is surrounding sidewalls and bottom of the first type gate trench, connecting with the body region and the P-shield (PS) region; the body region and the source region being shorted to a source metal through source contacts. Therefore, the PS region is grounded with source metal through the grounded GP region.

According to another aspect, in some preferred embodiments, the substrate has the first conductivity type. In some other preferred embodiments, the substrate has the first conductivity type, further comprises: a second P-shield (PS) region of the second type conductivity for gate oxide electric-filed reduction adjoining lower surface of the body region and space apart from the stripe gate trench. In some other preferred embodiments, the device further comprises: a super junction structure comprising a P column region of the second type conductivity disposed above the substrate.

According to another aspect, in some preferred embodiments, the substrate has the first conductivity type and the epitaxial layer comprises a single epitaxial layer having uniform doping concentration. In some other preferred embodiments, the substrate has the first conductivity type and the epitaxial layer comprises a single epitaxial layer having uniform doping concentration with resistivity R, the trenched semiconductor power device further comprises a buffer layer of the first conductivity type with resistivity Rn sandwiched between the substrate and the epitaxial layer, wherein R>Rn. In some other preferred embodiments, the substrate has the second conductivity type and the epitaxial layer comprises a single epitaxial layer having uniform doping concentration with resistivity R, the trenched semiconductor power device further comprises a buffer layer of the first conductivity type with resistivity Rn sandwiched between the substrate and the epitaxial layer, wherein R>Rn.

According to another aspect, in some preferred embodiments, the substrate has the second conductivity type, further comprises: a buffer layer of the first conductivity type formed sandwiched between the substrate and the epitaxial layer, a plurality of heavily doped regions of the first conductivity type in the substrate to form a plurality of alternating P+ and N+ regions in the substrate.

According to another aspect, the present invention also features a SiC power device further comprising a current spreading region of the first conductivity type surrounding at least sidewalls of the first type gate trench in the active area without having the grounded P (GP) region, wherein the current spreading layer has a higher doping concentration than the epitaxial layer.

According to another aspect, in some preferred embodiment, the P column region of the super junction structure is formed by multiple epi method. In some other preferred embodiment, the P column region of the super junction structure is formed by opening a deep trench filled up with an epitaxial layer of the second conductivity type.

The present invention also features a method for manufacturing a SiC power device comprising the steps of: growing an epitaxial layer of a first conductivity type onto a substrate of the first conductivity type, wherein the epitaxial layer has a lower doping concentration than the substrate; forming first type and second type gate trenches by performing the following steps: (a) forming a trench mask onto a top surface of the epitaxial layer for definition of a plurality of first type gate trenches; (b) forming the first type gate trenches in the epitaxial layer by etching through open regions in the trench mask; (c) forming a dielectric layer on sidewalls and bottoms of the first type gate trenches; (d) removing the dielectric layer of the bottoms of the first type gate trenches by anisotropic etch; (e) performing an anisotropic silicon etch to form a plurality of second type gate trenches.

According to another aspect, in some preferred embodiment, the method for manufacturing a trench semiconductor power device further comprising the steps of: carrying out an angle ion implantation of the second conductivity type dopant into the sidewalls and bottoms of the second type gate trenches to form a second conductivity type doped region surrounding the second type gate trenches.

According to another aspect, in some preferred embodiment, the method for manufacturing a trench semiconductor power device further comprising the steps of: a zero-degree ion implantation of the second conductivity type dopant.

According to another aspect, in some preferred embodiment, the method for manufacturing a trench semiconductor power device further comprising the steps of: depositing a BSG layer into the trenches after step (e) to form a second conductivity type doped region surrounding lower portion of the trenches.

According to another aspect, in some preferred embodiment, the method for manufacturing a trench semiconductor power device further comprising the steps of: forming a grounded P (GP) mask, performing wet dielectric layer etch and carrying out an angle ion implantation of the second conductivity type dopant into sidewalls and bottoms of the first type gate trenches to form a second conductivity type doped region surrounding the first type gate trenches.

According to another aspect, in some preferred embodiment, the method for manufacturing a trench semiconductor power device further comprising the steps of: (f) removing the dielectric layer; (g) forming a first insulating film along inner surfaces of the first type and the second type gate trenches, wherein the second type gate trenches is filled up by the first insulation film; (h) etching back the first insulating film from upper portion of the first type gate trenches; (i) forming a second insulating film as a gate oxide layer on sidewalls of the trenches; (j) depositing a doped poly-silicon layer into the first type gate trenches; (k) etching back the first doped poly-silicon to form a gate electrode.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The accompanying drawings, which are included to provide a further understanding of the invention and are incorporated in and constitute a part of this specification, illustrate exemplary embodiments of the invention and together with the description serve to explain the principles of the invention. In the drawings.

DETAILED DESCRIPTION OF THE EMBODIMENTS

In the following Detailed Description, reference is made to the accompanying drawings, which forms a part thereof, and in which is shown by way of illustration specific embodiments in which the invention may be practiced. In this regard, directional terminology, such as "top", "bottom", "front", "back", etc., is used with reference to the orientation of the Figure(s) being described. Because components can be positioned in a number of different orientations, the directional terminology is used for purpose of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1:
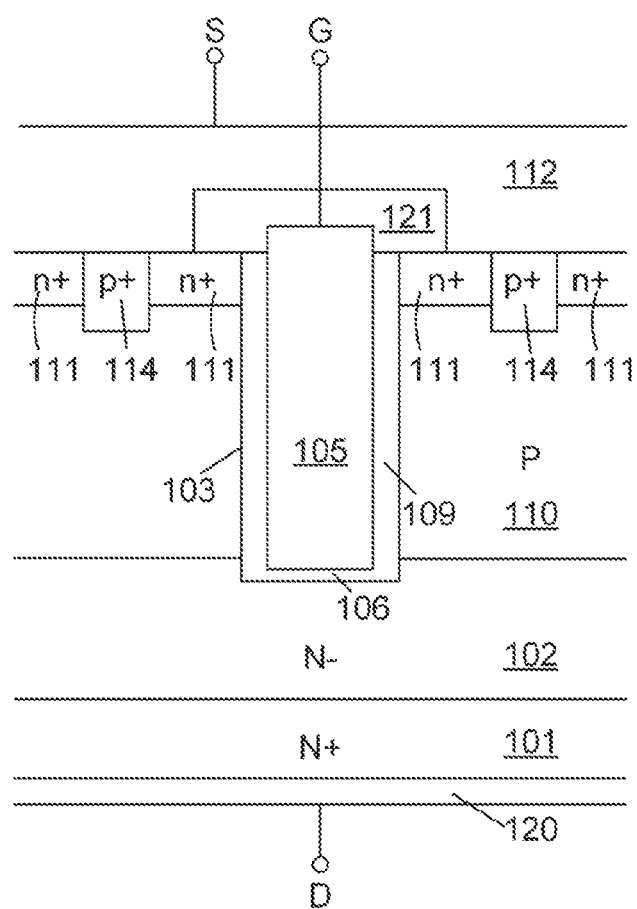
FIG. 1 is a cross-sectional view of a conventional SiC semiconductor device having a trench gate vertical double diffused MOSFET.
Figure 2:
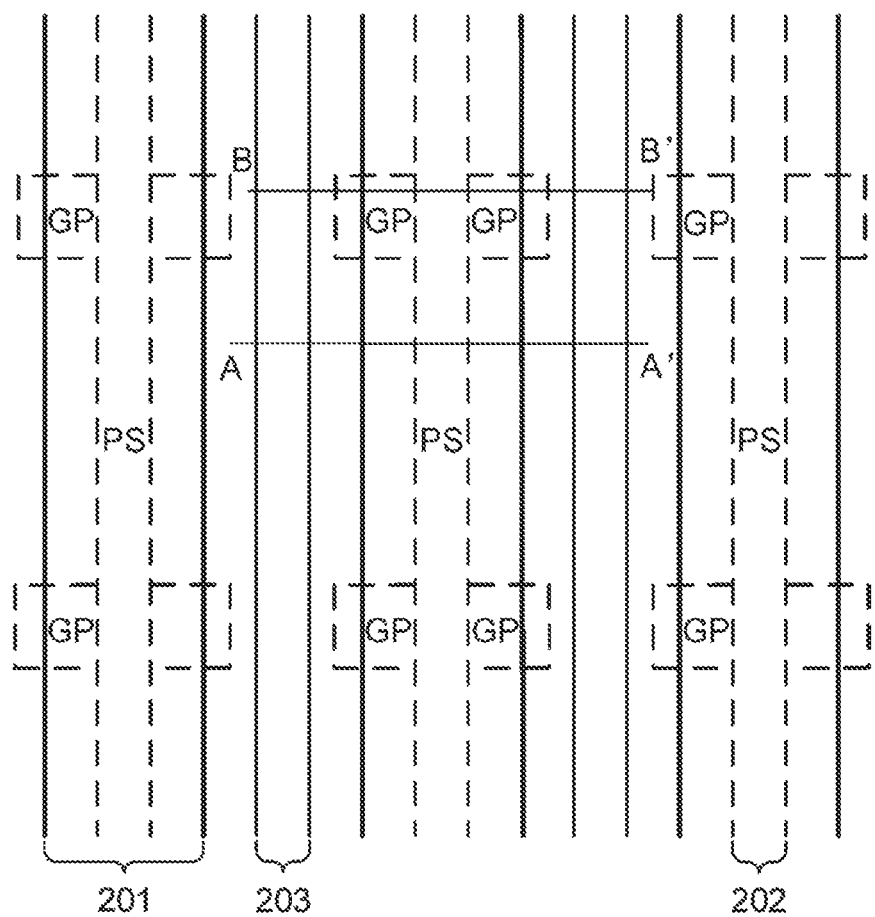
FIG. 2 is a top view of a preferred embodiment for a trench semiconductor power device with stripe cells layout according to the present invention.

Please refer to FIG. 2 for a top view of a trench semiconductor power device with stripe cells layout. A gate trench 201 surrounds a P-shield (PS) region 202 in each unit cell, wherein the gate trench 201 has stripe shape, and the PS region 202 is connected with grounded P (GP) regions. Trenched source contacts 203 are disposed between the adjacent gate trenches 201.

Figure 3A:
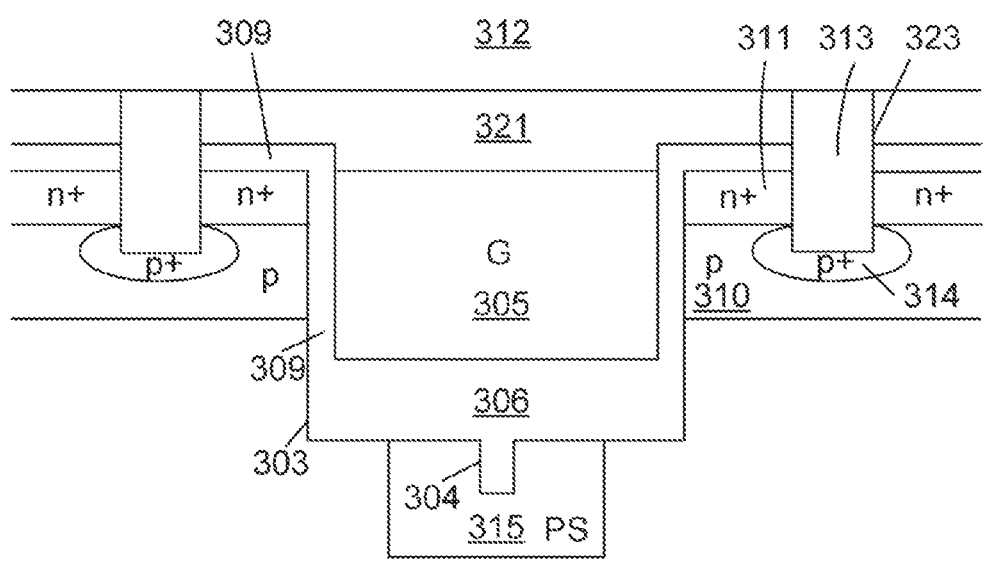
FIG. 3A is a cross-sectional view showing a preferred A-A' cross section of FIG. 2 according to the present invention.
Figure 3A:
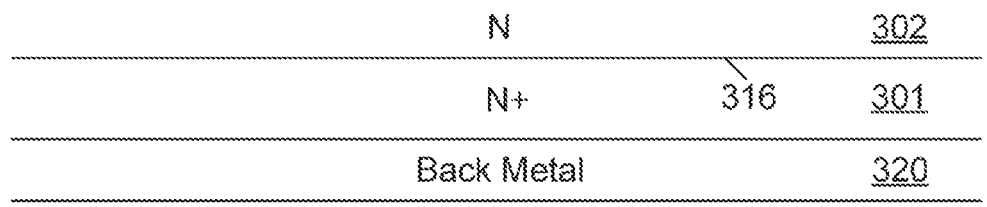

Please refer to FIG. 3A for a preferred A-A' cross-sectional view of FIG. 2. A SiC power device comprising a trench MOSFET formed on an N+ type SiC substrate 301 with a less doped N type SiC epitaxial layer 302 extending thereon, wherein the N+ substrate 301 is coated with a back metal 320 of Ti/Ni/Ag on rear side as a drain metal. Inside the N epitaxial layer 302, a plurality of trenches having first type gate trenches 303 and second type gate trenches 304 are formed vertically downward from top surface of the epitaxial layer 302 and not reaching the interface 316 between the N epitaxial layer 302 and the N+ substrate 301, wherein the first type gate trenches 303 is above the second type gate trenches 304 and width of the first type gate trenches 303 is greater than that of the second type gate trenches 304. A gate electrode 305 is disposed in upper portion of the first type gate trenches 303 and surrounded with a thick bottom oxide as the first insulating film 306 on bottom of the first type gate trenches 303, and surrounded with a second insulating film 309 on sidewalls of the gate trenches 303, wherein the second insulating film 309 has a less thickness than the first insulating film 306. The second type gate trenches 304 are filled up with the first insulating film 306. Between every two adjacent first type gate trenches 303, a p body region 310 with n+ source regions 311 thereon is extending near top surface of the N epitaxial layer 302 and surrounding the gate electrode 305 padded by the second insulating film 309. An interlayer dielectric film 321 is stacked on the epitaxial layer 302, and the source metal 312 is formed onto the interlayer dielectric film 321. The p body regions 310, the n+ source regions 311 are further shorted to a source metal 312 comprising Ti/TiN/Al alloys through a plurality of trenched contacts 323 filled with contact plugs 313 comprising Ti/TiN/Al alloys and surrounded by p+ heavily doped regions 314 around bottoms underneath the n+ source regions 311. According to the invention, P-shield (PS) regions 315, which is adjacent to sidewalls and bottoms of the second type gate trenches 304, are introduced into the N epitaxial layer 302 by an angle ion-implantation or combination of a zero-degree ion implantation of boron through sidewalls and bottoms of the second type gate trenches 304, or by a BSG layer deposition procedure. Width of the P-shield (PS) regions 315 is designed narrower than the first type gate trench 303 as the second type gate trench 304 is narrower than the first type gate trench 303.

Figure 3B:
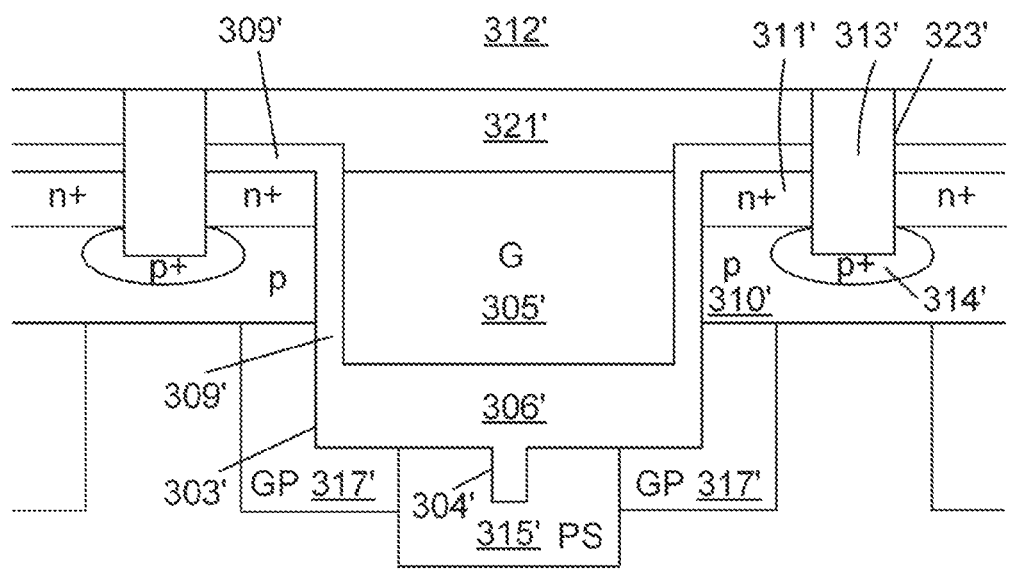
FIG. 3B is a cross-sectional view showing a preferred B-B' cross section of FIG. 2 according to the present invention.
Figure 3B:
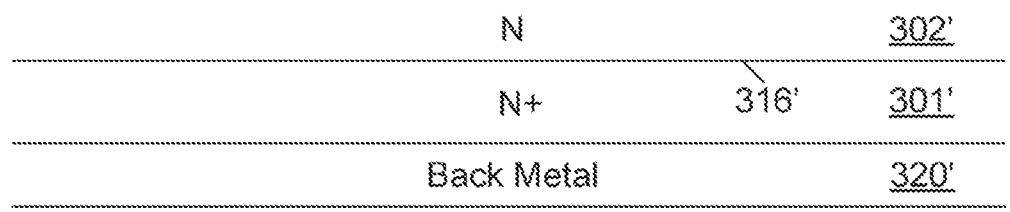

Please refer to FIG. 3B for a preferred B-B' cross-sectional view of FIG. 2, the trenched semiconductor power device has a similar structure to FIG. 3A, except that in the present invention, grounded P (GP) regions 317' are formed surrounding sidewalls and bottom of the first type gate trench 303', connecting with the p body region 310' and the P-shield (PS) region 315' being shorted to the source metal 312'. Width of the PS region 315' can be designed narrower than the first type gate trench 303' as result of the second type gate trench 304' is narrower than the first type gate trench 303'. Therefore, on resistance is reduced as a result of less pinch-off effect between the two adjacent PS regions 315'.

Figure 4A:
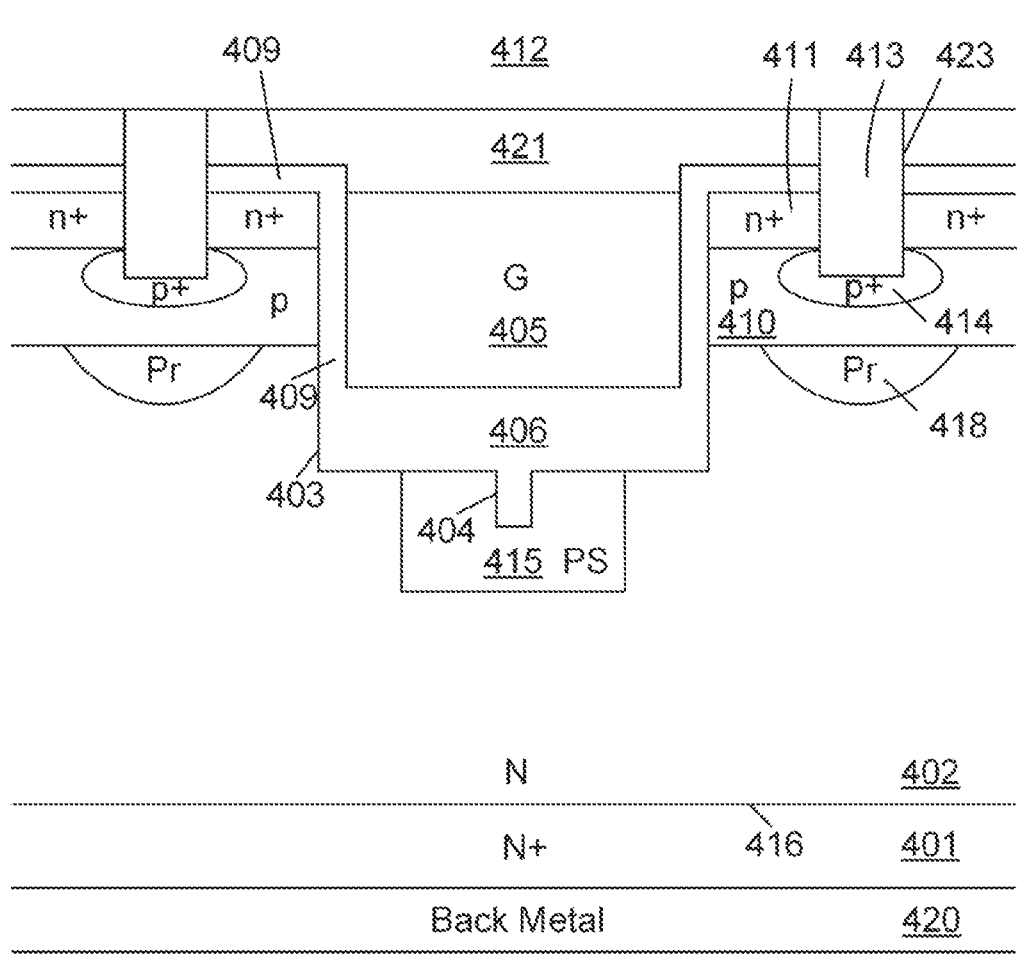
FIG. 4A is a cross-sectional view showing another preferred A-A' cross section of FIG. 2 according to the present invention.

Please refer to FIG. 4A for another preferred A-A' cross-sectional view of FIG. 2. The trenched semiconductor power device has a similar structure to FIG. 3A, except that the present structure further includes a p type gate oxide electric field reducing regions 418 (Pr, as illustrated) as second PS regions, adjoining lower surfaces of the p body regions 410 and space apart from the trenches. The trenched source contacts 423 in the present structure are filled with contact plugs 413 comprising Ti/TiN/W layers while the source metal 412 comprising Al Alloys.

Figure 4B:
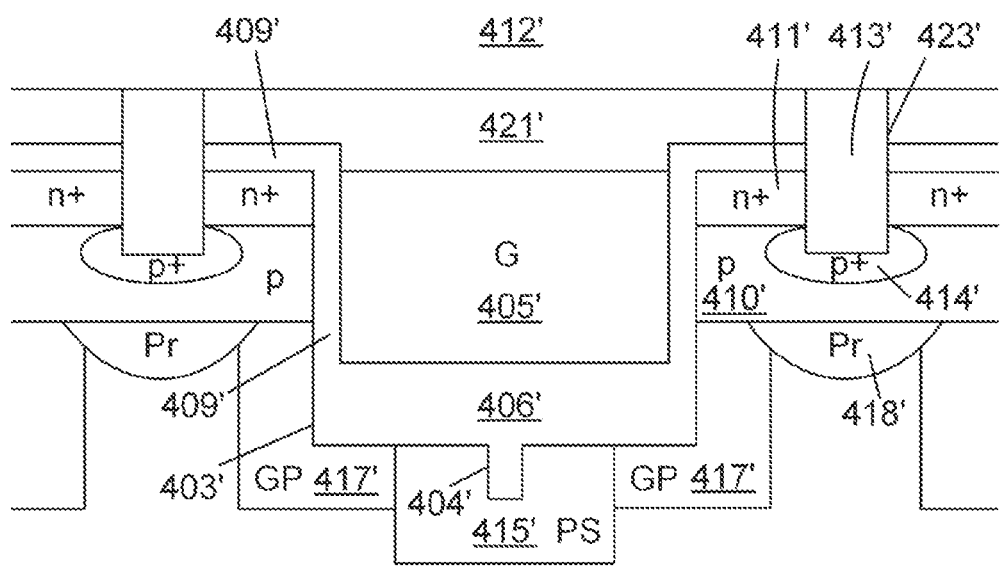
FIG. 4B is a cross-sectional view showing another preferred B-B' cross section of FIG. 2 according to the present invention.
Figure 4B:
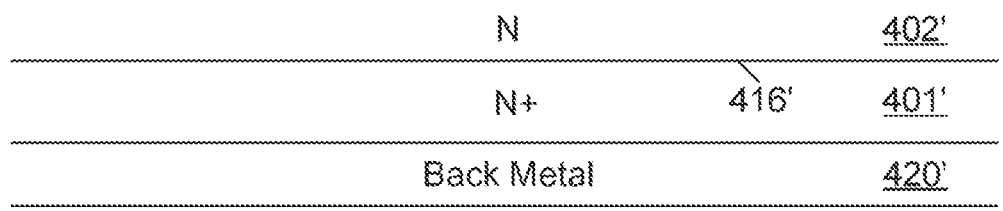

Please refer to FIG. 4B for another preferred B-B' cross-sectional view of FIG. 2. The trenched semiconductor power device has a similar structure to FIG. 4A, except that in the present invention, grounded P (GP) regions 41T are formed surrounding sidewalls and bottom of the first type gate trench 403' connecting with the p body region 410' and the P-shield (PS) region 415' being shorted to the source metal 412'.

Figure 5A:
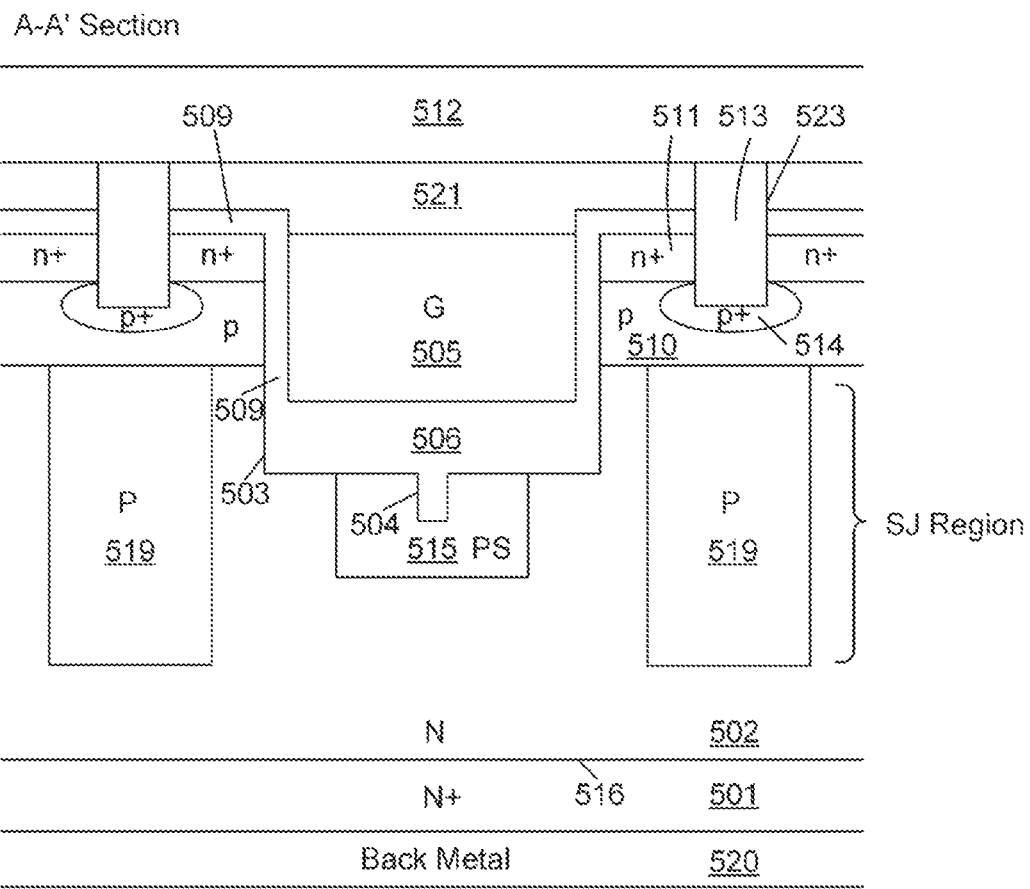
FIG. 5A is a cross-sectional view showing another preferred A-A' cross section of FIG. 2 according to the present invention.

Please refer to FIG. 5A for another preferred A-A' cross-sectional view of FIG. 2. The trenched semiconductor power device has a similar structure to FIG. 3A, except that in the present structure, P column regions 519 are introduced into the N epitaxial layer 502 to form a super junction (SJ) region, comprising a plurality of alternating P regions 519 and N regions 502 above the N+ substrate 501. The P column regions 519 can be easily formed below the p body regions 510 and above the bottom surface 516 of the N epitaxial layer 502 by multiple epi method or by opening a deep trench filled up with an epitaxial layer of the second conductivity type method. The trenched source contacts 523 in the present structure are filled with contact plugs 513 comprising Ti/TiN/Al layers while the source metal 512 comprising Ti/TiN/Al Alloys.

Figure 5B:
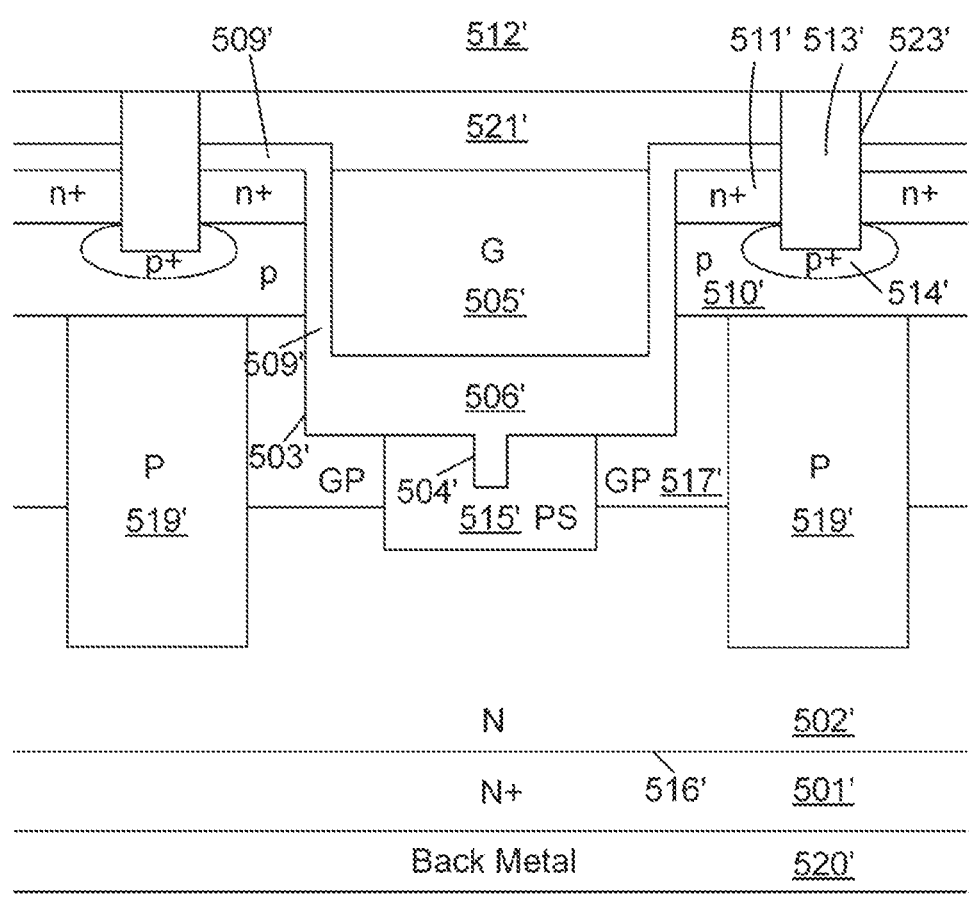
FIG. 5B is a cross-sectional view showing another preferred B-B' cross section of FIG. 2 according to the present invention.

Please refer to FIG. 5B for another preferred B-B' cross-sectional view of FIG. 2. The trenched semiconductor power device has a similar structure to FIG. 5A, except that in the present invention, grounded P (GP) regions 517' are formed surrounding sidewalls and bottom of the first type gate trench 503', connecting with the p body region 510' and the P-shield (PS) region 515' being shorted to the source metal 512'.

Figure 6:
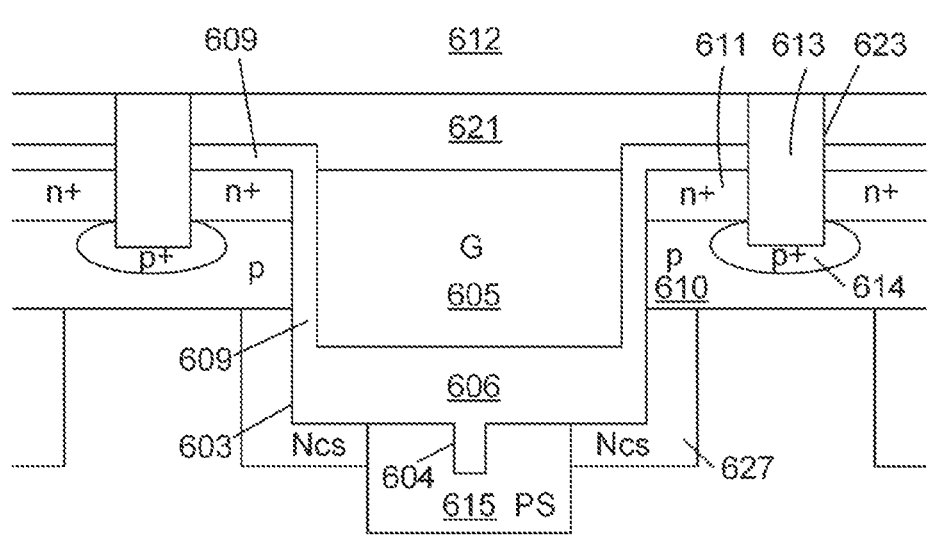
FIG. 6 is a cross-sectional view showing another preferred A-A' cross section of FIG. 2 according to the present invention.

Please refer to FIG. 6 for another preferred A-A' cross-sectional view of FIG. 2. The trenched semiconductor power device has a similar structure to FIG. 3A, except that in the present structure, a current spreading layer 627 of the first conductivity type (Ncs, as illustrated) is encompassed in upper portion of the epitaxial layer 602 and below the p body regions 610. The Ncs region 627 is introduced to avoid P-shield (PS) region 615 pinching off current path between two PS regions, wherein the Ncs region 627 has a higher doping concentration than the N epitaxial layer 602. The trenched source contacts 623 in the present structure are filled with contact plugs 613 comprising Ti/TiN/Al layers while the source metal 612 comprising Ti/TiN/Al Alloys.

Figure 7:
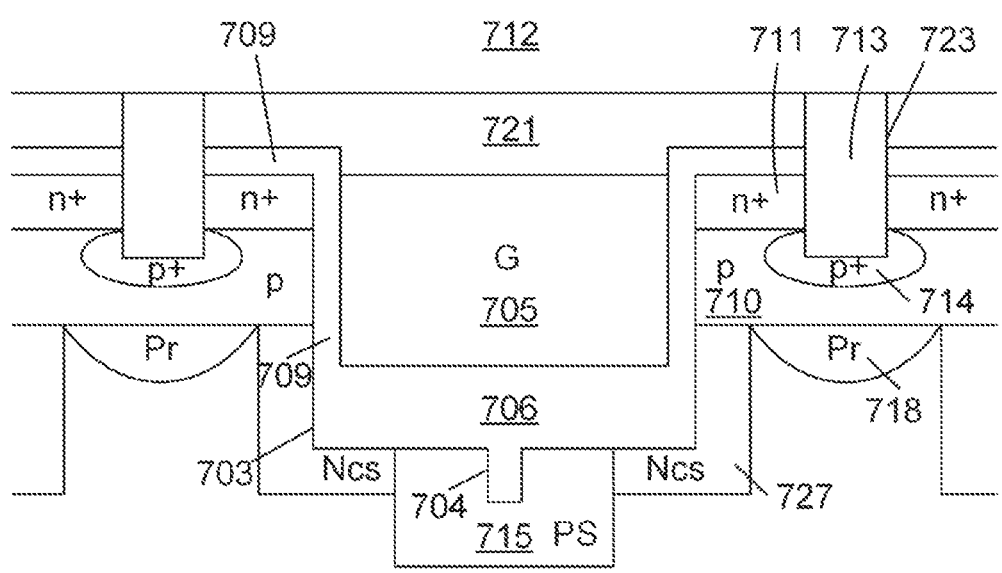
FIG. 7 is a cross-sectional view showing another preferred A-A' cross section of FIG. 2 according to the present invention.
Figure 7:
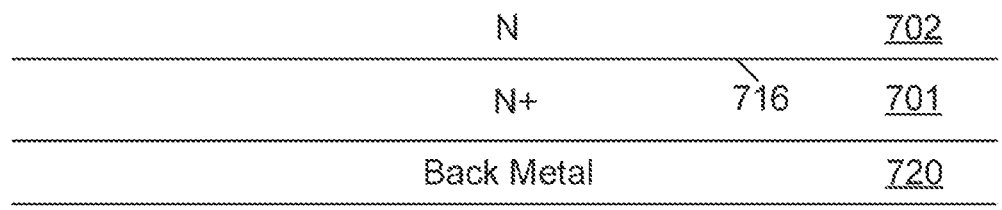

Please refer to FIG. 7 for another preferred A-A' cross-sectional view of FIG. 2. The trenched semiconductor power device has a similar structure to FIG. 4A, except that in the present structure, a current spreading layer 727 of the first conductivity type (Ncs, as illustrated) is encompassed in upper portion of the epitaxial layer 702 and below the p body regions 710. The Ncs region 727 is introduced to avoid P-shield (PS) region 715 pinching off current path between two PS regions, wherein the Ncs region 727 has a higher doping concentration than the N epitaxial layer 702. The trenched source contacts 723 in the present structure are filled with contact plugs 713 comprising Ti/TiN/W layers while the source metal 712 comprising Al Alloys.

Figure 8A:
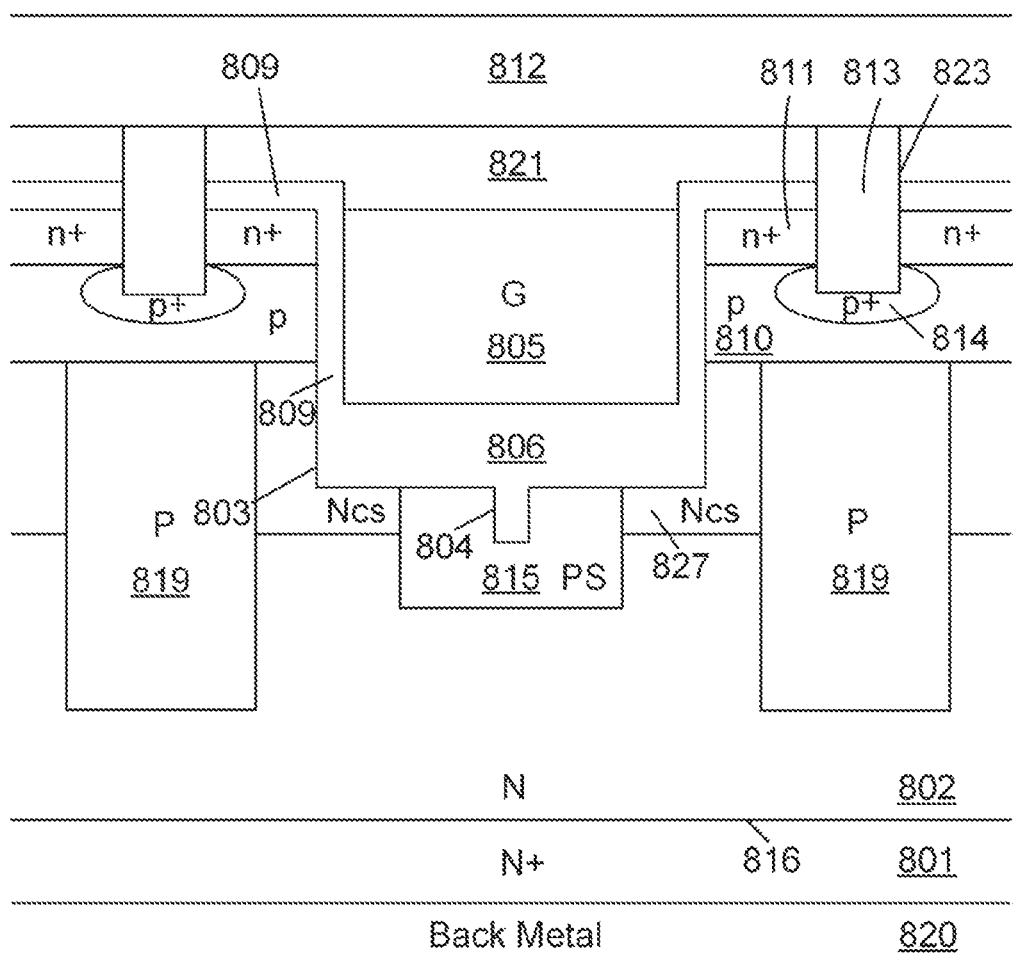
FIG. 8A is a cross-sectional view of another preferred embodiment according to the present invention.

Please refer to FIG. 8A for another preferred embodiment of the present invention. The trenched semiconductor power device has a similar structure to FIG. 5A, except that in the present structure, a current spreading layer 827 of the first conductivity type (Ncs, as illustrated) is encompassed in upper portion of the epitaxial layer 802 and below the p body regions 810. The Ncs region 827 is introduced to avoid P-shield (PS) region 815 pinching off current path between two PS regions, wherein the Ncs region 827 has a higher doping concentration than the N epitaxial layer 802. The trenched source contacts 823 in the present structure are filled with contact plugs 813 comprising Ti/TiN/W layers while the source metal 812 comprising Al Alloys.

Figure 8B:
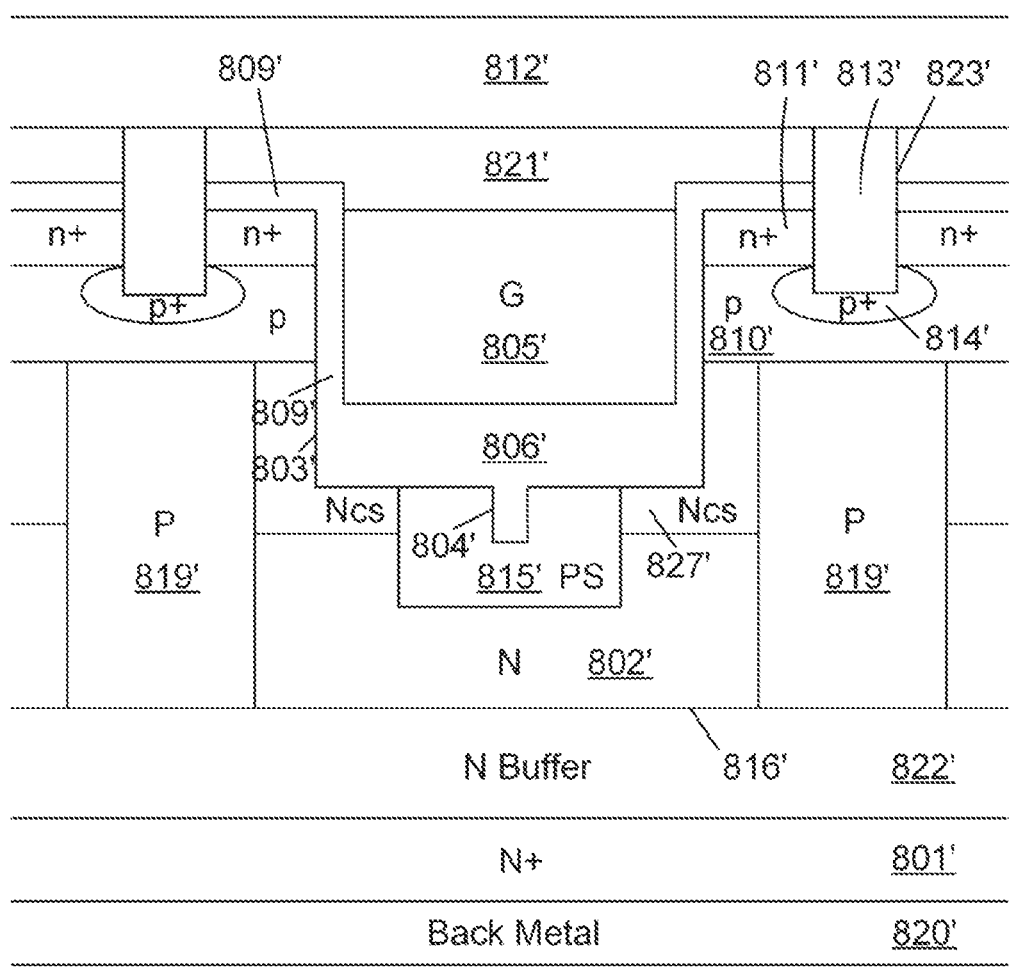
FIG. 8B is a cross-sectional view of another preferred embodiment according to the present invention.

Please refer to FIG. 8B for another preferred embodiment of the present invention. The trenched semiconductor power device has a similar structure to FIG. 8A, except that in FIG. 8B, the invention further comprises a N buffer layer 822' with resistivity Rn sandwiched between the N+ substrate 801' and the N epitaxial layer 802', the N epitaxial layer 802' comprises a single epitaxial layer having uniform doping concentration with resistivity R, wherein R>Rn. Besides, the P column regions 819' can be easily formed below the p body regions 810' and touch to the bottom surface 816' of the N epitaxial layer 802' by multiple epi method or by opening a deep trench filled up with an epitaxial layer of the second conductivity type method.

Figure 9:
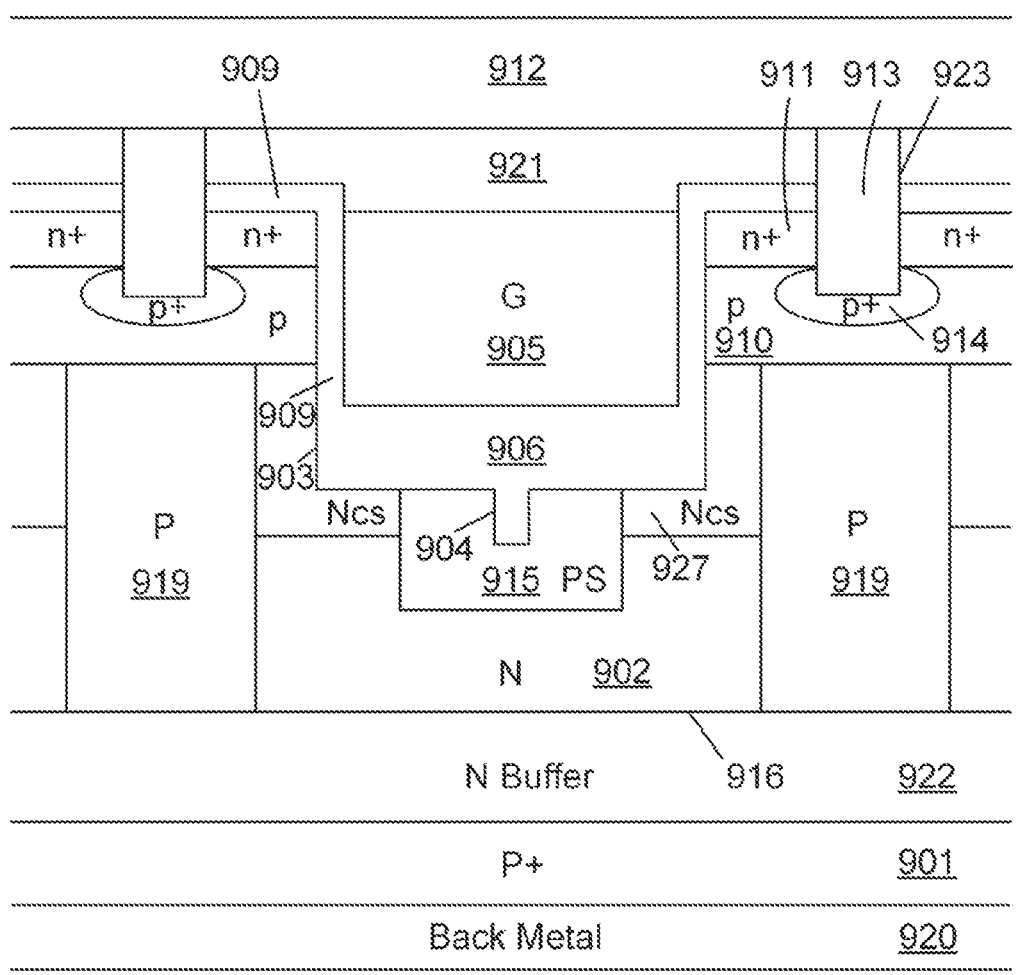
FIG. 9 is a cross-sectional view of a preferred IGBT embodiment according to the present invention.

Please refer to FIG. 9 for another preferred embodiment of the present invention, the trenched semiconductor power device representing an IGBT (Insulating Gate Bipolar Transistor) device has a similar structure to FIG. 8B, except that, in the present invention, the IGBT is formed onto a P+ substrate 901 and further comprises a N buffer layer 922 with resistivity Rn between the P+ substrate 901 and the N epitaxial layer 902. The N epitaxial layer 902 comprises a single epitaxial layer having uniform doping concentration with resistivity R, wherein R>Rn.

Figure 10:
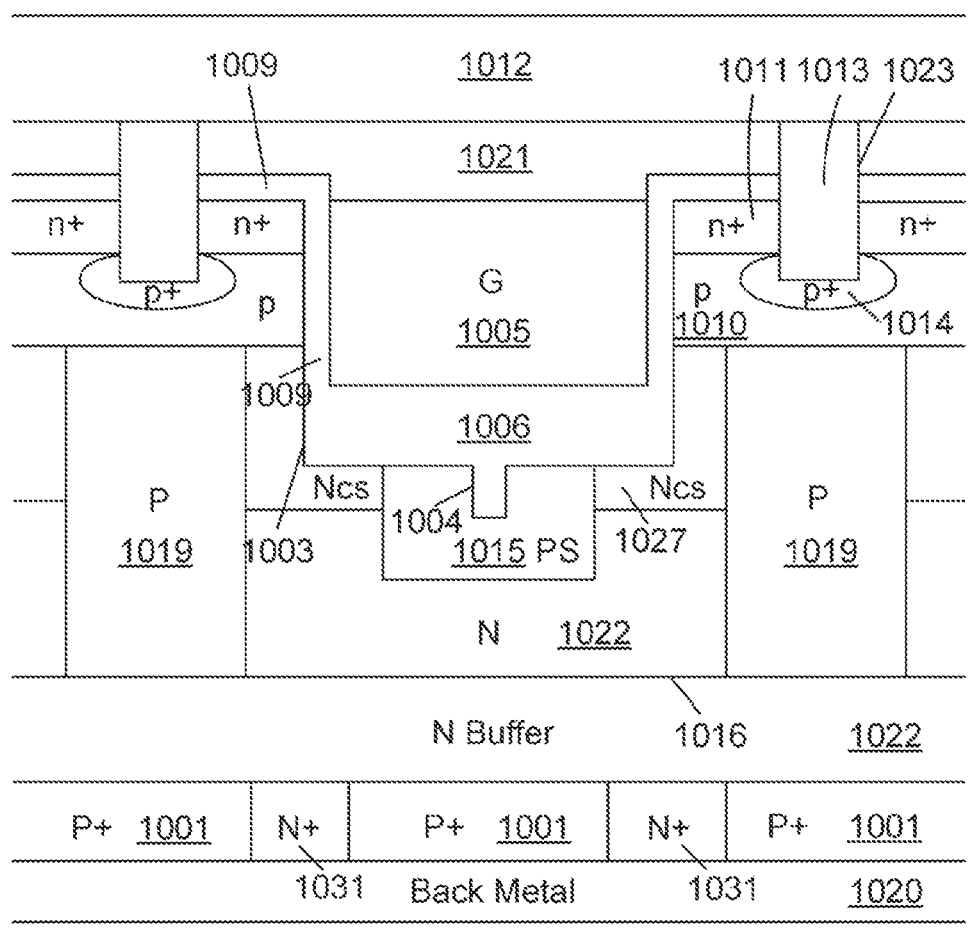
FIG. 10 is a cross-sectional view of another preferred IGBT embodiment with integrated reverse conducting diode according to the present invention.

Please refer to FIG. 10 for another preferred embodiment of the present invention, the trenched semiconductor power device has a similar structure to FIG. 9, except that, the IGBT in FIG. 10 further comprise a plurality of heavily doped N+ regions 1031 formed in the P+ substrate 1001 to form a plurality of alternating P+ and N+ regions to serve as integrated reverse conducting diode.

Figure 11A:
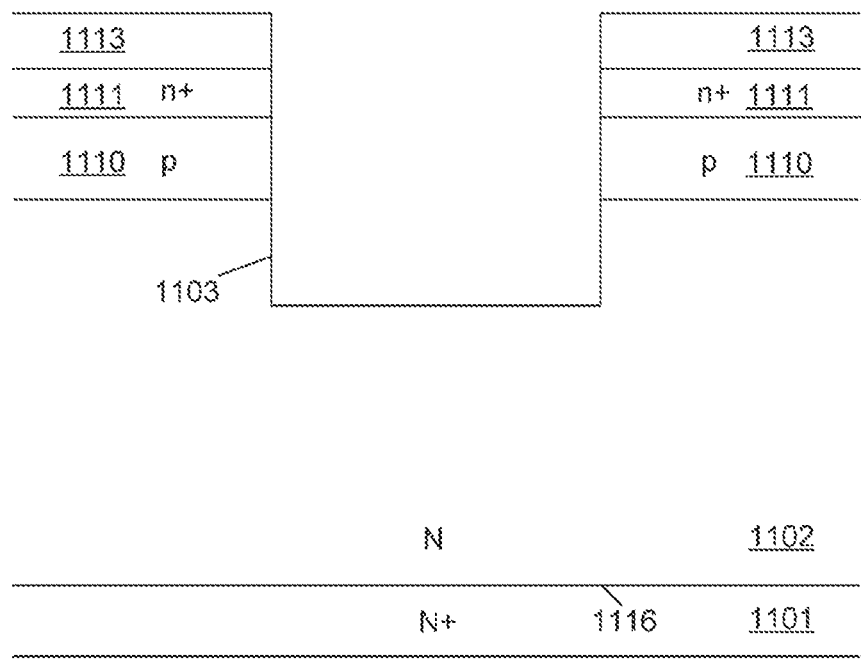
FIGS. 11A~11P are a serial of side cross-sectional views for showing the processing steps for fabricating the SiC trench MOSFET of FIG. 4A and FIG. 4B.
Figure 11B:
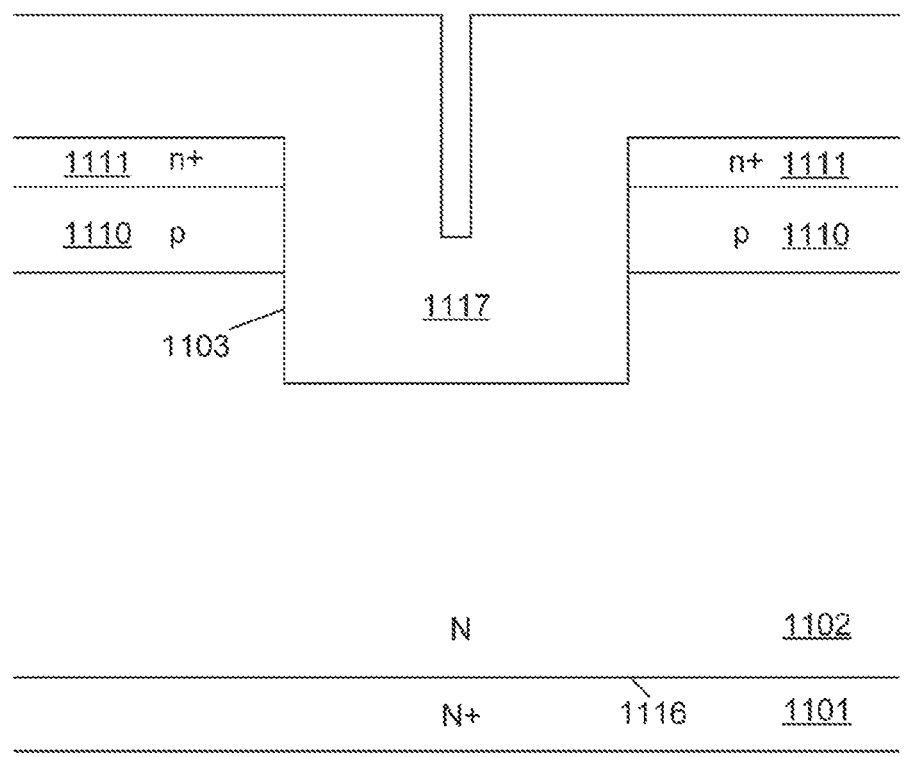
Figure 11C:
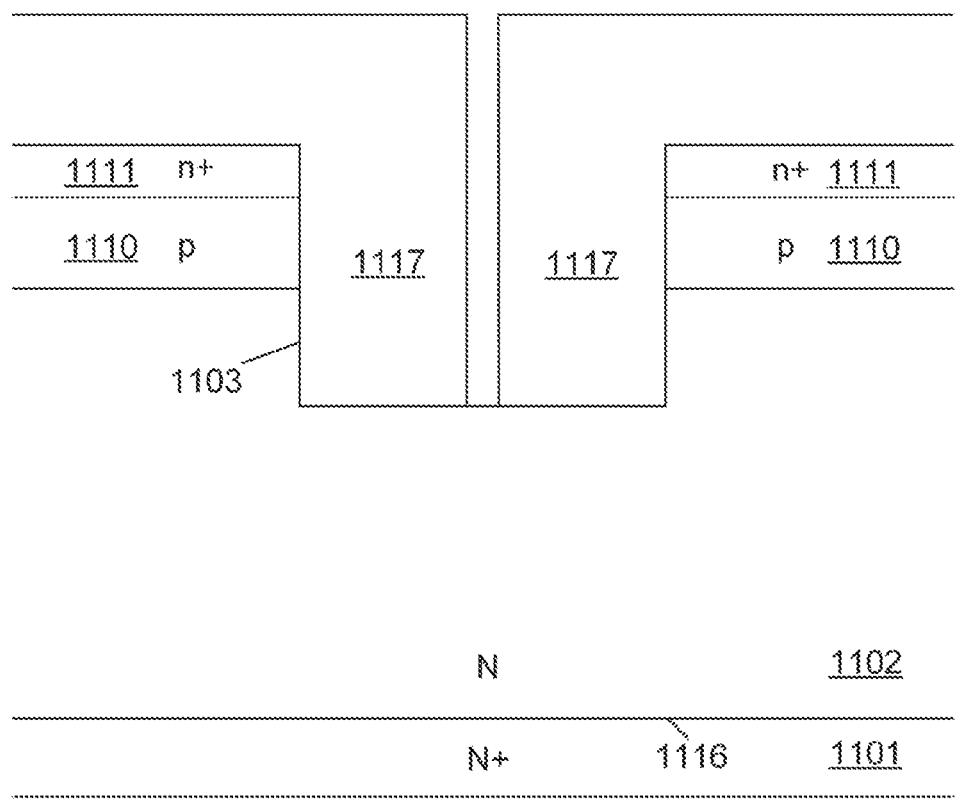
Figure 11D:
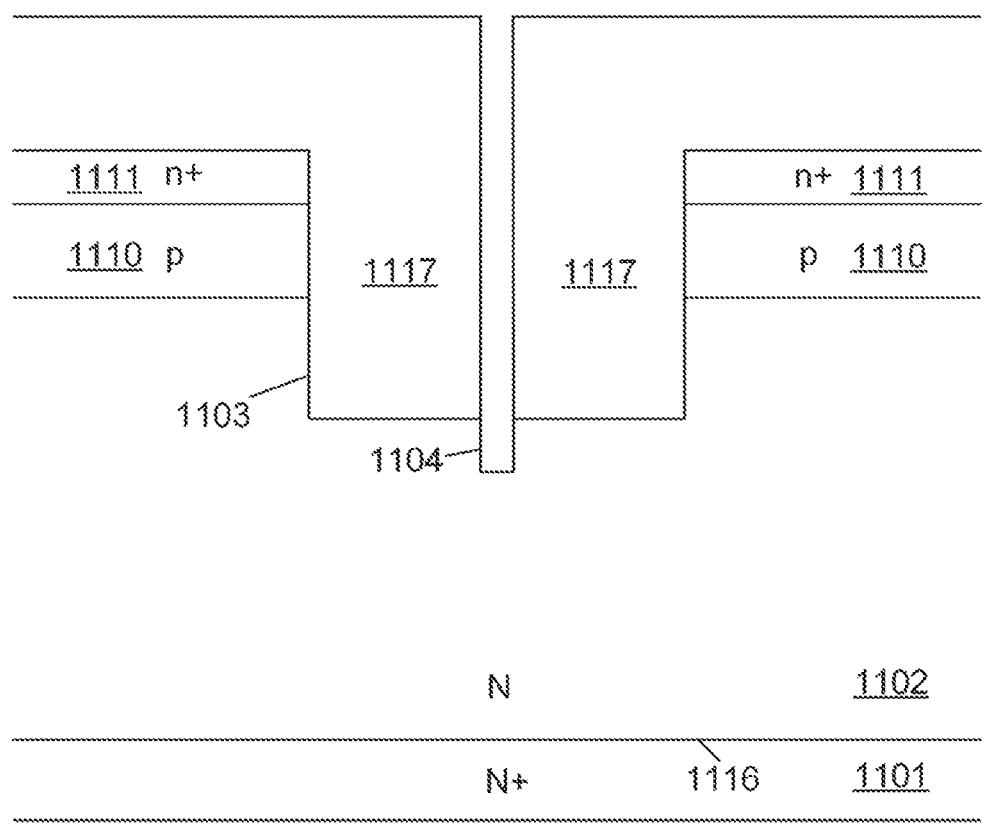
Figure 11E:
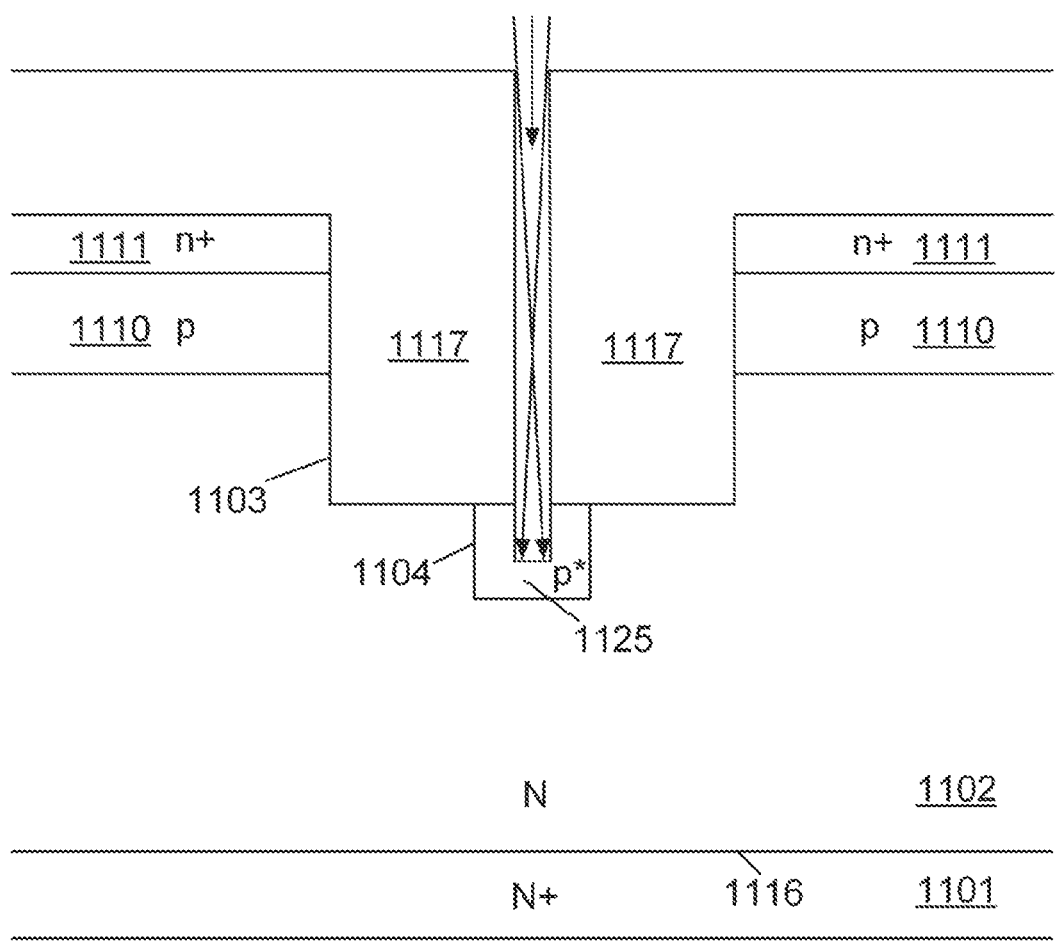
Figure 11F:
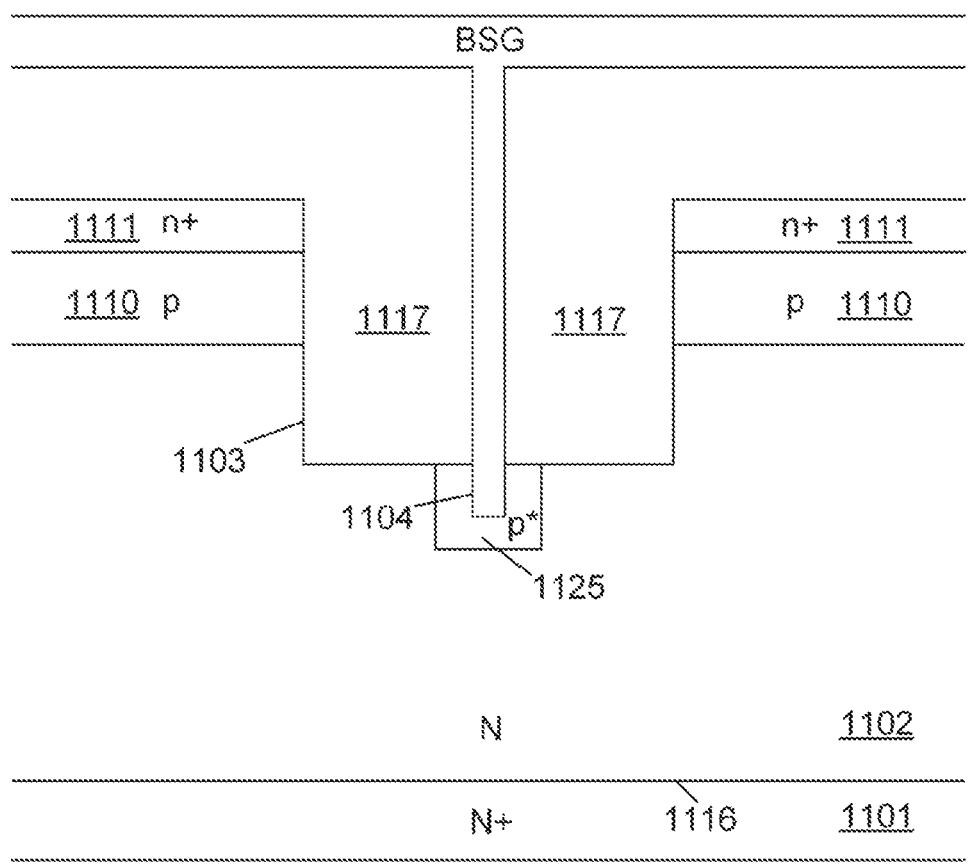
Figure 11G:
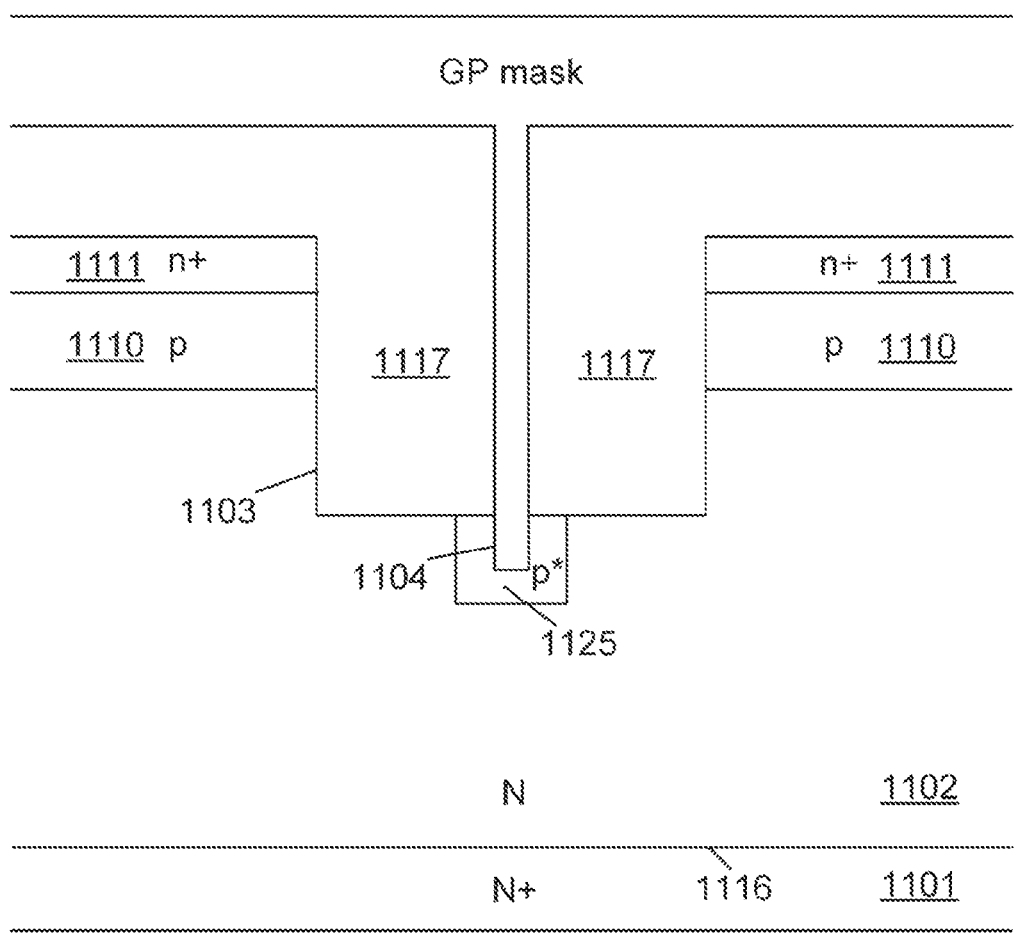
Figure 11H:
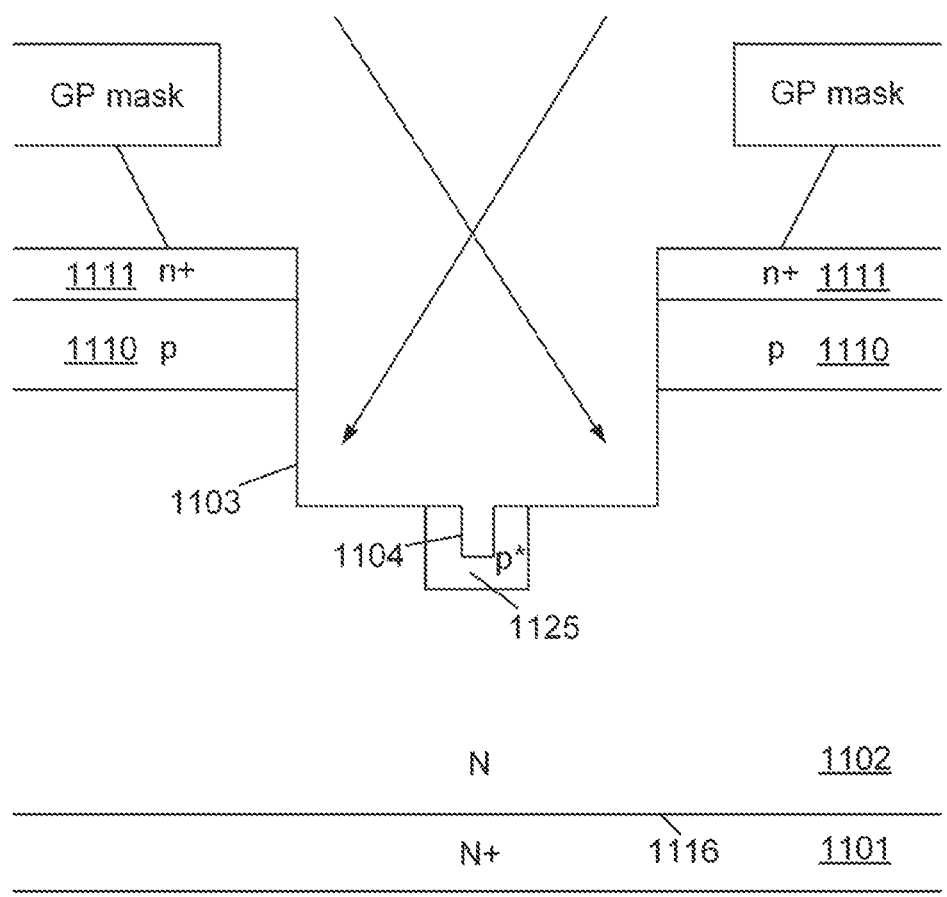
Figure 1I:
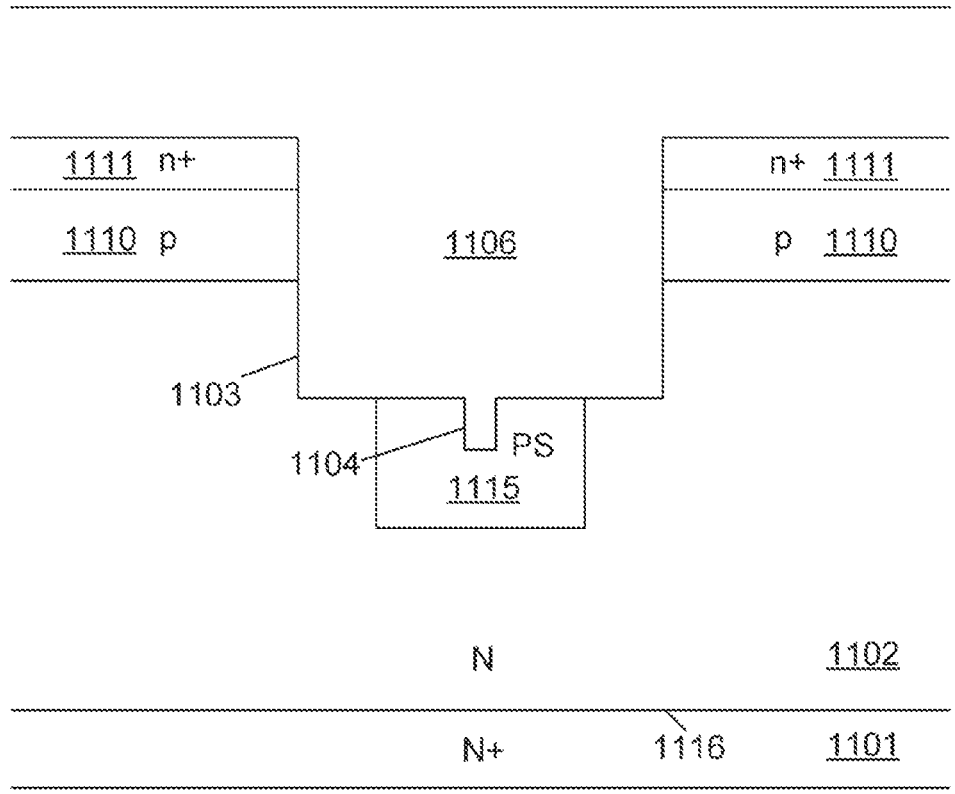
Figure 11J:
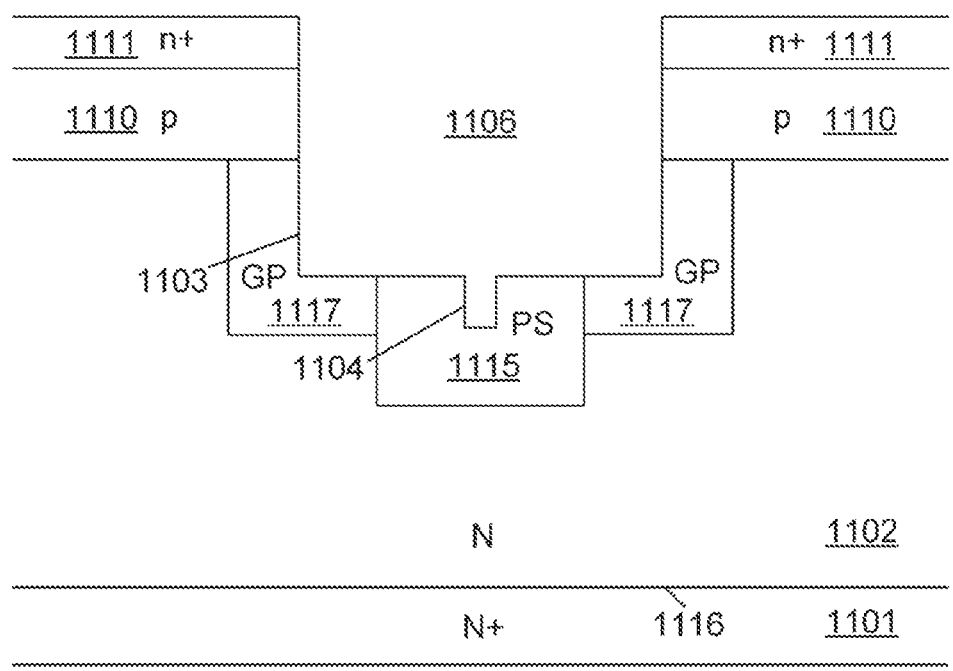
Figure 11K:
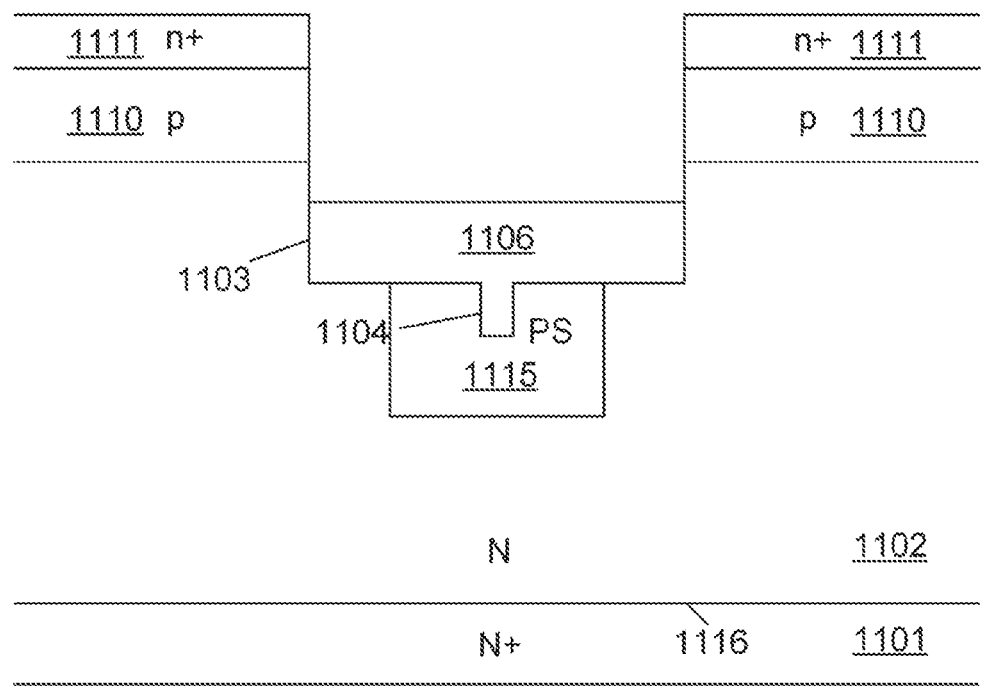
Figure 11L:
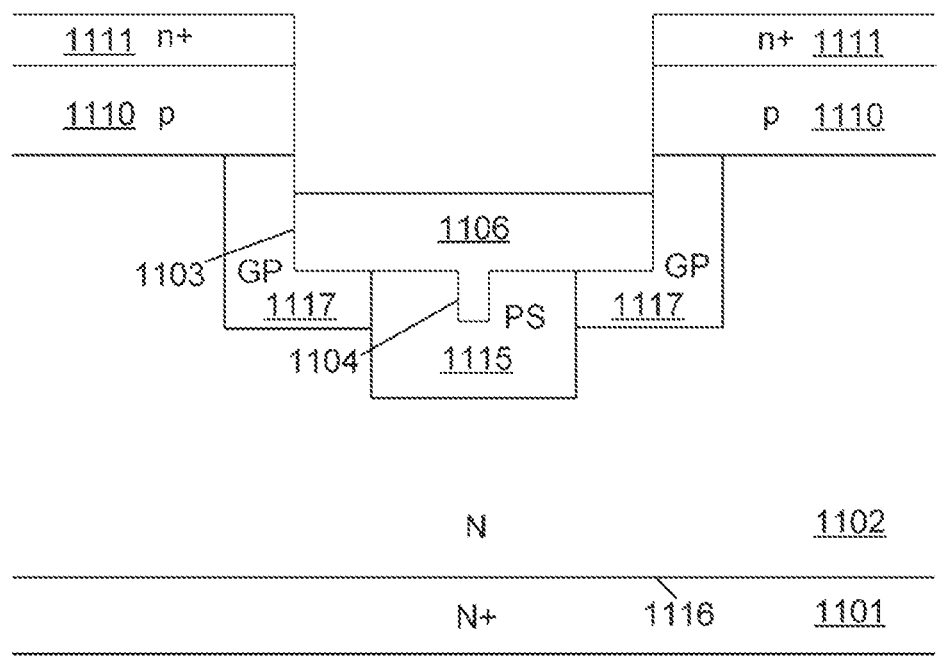
Figure 11M:
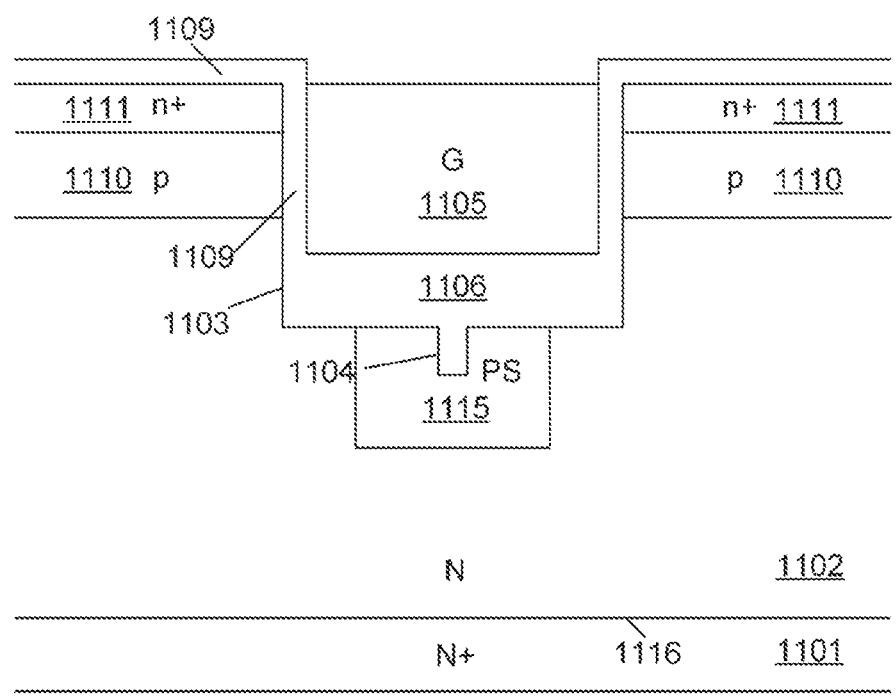
Figure 11N:
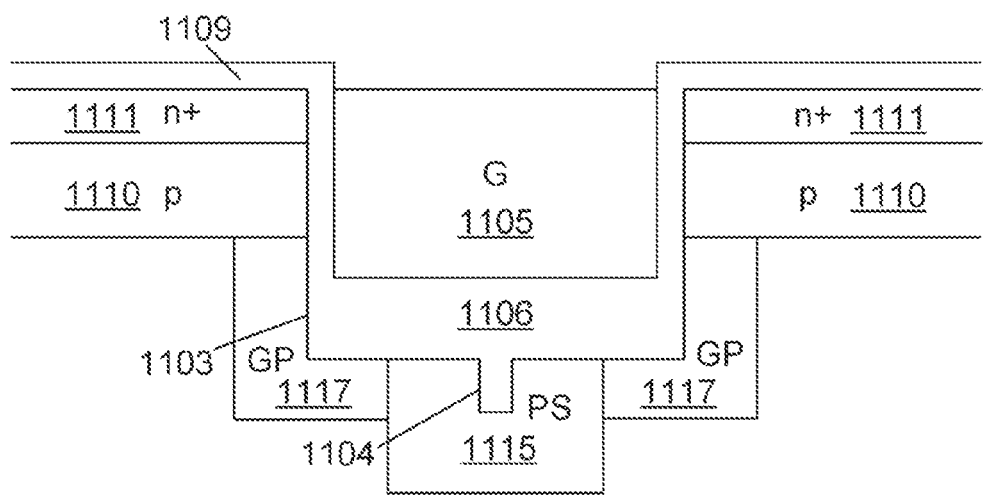
Figure 11O:
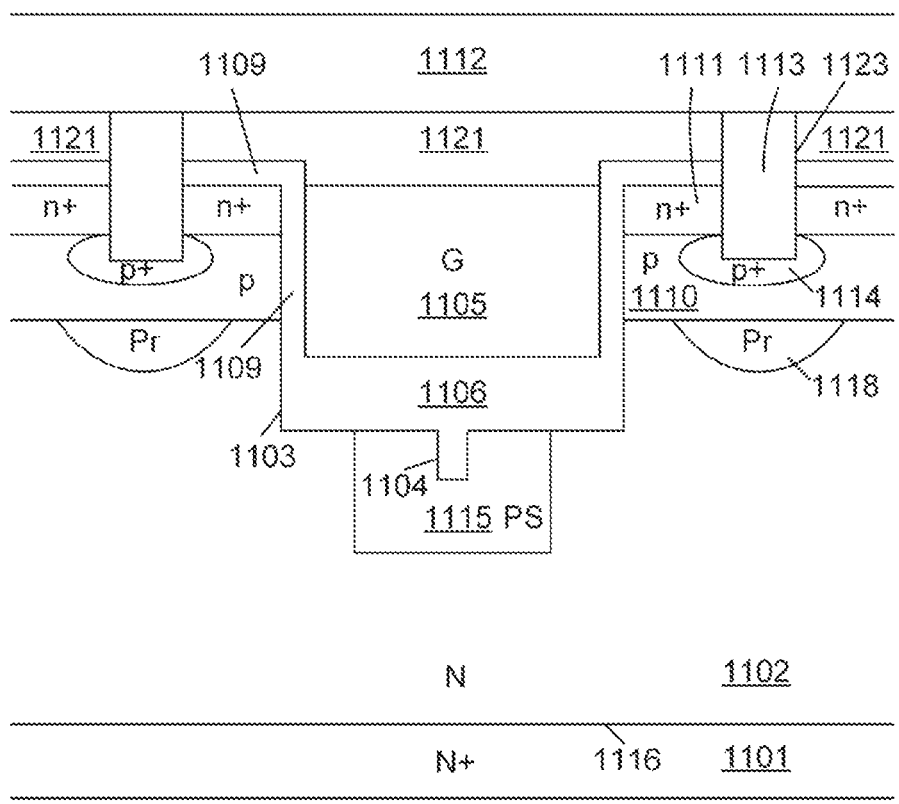

FIGS. 11A~11O are a serial of exemplary steps that are performed to form the invention embodiment of FIG. 4A and FIG. 4B. In FIG. 11A, an N epitaxial layer 1102 is grown onto a N+ type SiC substrate 1101, wherein the N epitaxial layer 1102 has a lower doping concentration than the N+ substrate 1101. A p body region 1110 and an n+ source region 111 are then formed into the N epitaxial layer 1102 in active area. A hard mask 1113 such as an oxide layer is formed onto a top surface of the N epitaxial layer 1102 for definition of areas for a plurality of first type gate trenches 1103. Then, after dry oxide etch and dry silicon etch, a plurality of first type gate trenches 1103 are formed penetrating through open regions in the hard mask, the N epitaxial layer 1102, and not reaching the bottom surface 1116 of N epitaxial layer 1102. A sacrificial oxide layer (not shown) is first grown and then removed to eliminate the plasma damage after forming the gate trenches 1103.

In FIG. 11B, a dielectric layer 1117 is formed by oxide deposition or thermal oxide growing method on sidewalls and bottoms of the first type gate trenches 1103.

In FIG. 11C, dielectric layer on bottoms of the first type gate trenches 1103 is removed by dry oxide etching.

In FIG. 11D, an anisotropic silicon etch is performed to form a plurality of the second type gate trenches 1104.

In FIG. 11E, an angle ion implantation into sidewalls and bottom of the second type gate trenches 1104 and a diffusion step are successively carried out to form a p* region 1125 surrounding the second ty pc trenches 1104. Moreover, combination of zero degree and angle boron ion implantation would be carried out if bottom of trench 1104 is too narrow.

In FIG. 11F, a BSG layer is deposited into both the two type trenches to provide an alternate way to form a p* region 1125 surrounding the second type gate trenches 1104.

In FIG. 11G and FIG. 11H, a grounded P (GP) mask such as an oxide layer is formed onto a top surface of the N epitaxial layer 1102, and wet dielectric layer etching and an angle ion implantation of the second conductivity type dopant into the sidewalls and bottoms of the first type gate trenches 1103 are performed to form a second conductivity type doped region surrounding the first type gate trenches to form a A-A' cross-sectional structure and B-B' cross-sectional structure, respectively.

In FIG. 11I, A-A' cross-sectional structure with P-shield (PS) region 1115 is formed, and the GP mask and the dielectric layer 1117 are then removed. A first insulating film 1106 comprising a thick oxide layer is formed along inner surfaces of both the two type gate trenches 1103 and 1104 and top surface of N epitaxial layer 1102 by thermal oxide growth or thick oxide deposition, wherein the second type gate trenches 1104 are filled up with the first insulating film 1106.

In FIG. 11J, B-B' cross-sectional structure with P-shield (PS) region 1115 and grounded P regions 1117 is formed, the GP mask and the dielectric layer 1117 are then removed. A first insulating film 1106 comprising a thick oxide layer is formed along inner surfaces of both the two type gate trenches 1103 and 1104 and top surface of N epitaxial layer 1102 by thermal oxide growth or thick oxide deposition, wherein the second type gate trenches 1104 are filled up with the first insulating film 1106.

In FIG. 11K, A-A' cross-sectional structure is shown, and the first insulating film 1106 is etched back from top surface of the N epitaxial layer 1102 and the upper portion of the first type gate trenches 1103.

In FIG. 11L, B-B' cross-sectional structure is shown, and the first insulating film 1106 is etched back from top surface of the N epitaxial layer 1102 and the upper portion of the first type gate trenches 1103.

In FIG. 11M, A-A' cross-sectional structure is shown, the second insulating film 1109 is then thermally grown or deposited along sidewalls of the first type gate trenches 1103 and top surfaces of the N epitaxial layer 1102 as a gate oxide, which is thinner than the first insulation layer 1106. After that, a first doped poly-silicon layer is deposited onto the first gate insulating film 1106 to fill the upper portions of the first type gate trenches 1103, and then etched back by CMP (Chemical Mechanical Polishing) or Plasma Etch or Poly recess etch to serve as the single gate electrodes 1105.

In FIG. 11N, B-B' cross-sectional structure is shown, the second insulating film 1109 is then thermally grown or deposited along sidewalls of the first type gate trenches 1103 and top surfaces of the N epitaxial layer 1102 as a gate oxide, which is thinner than the first insulation layer 1106. After that, a first doped poly-silicon layer is deposited onto the first gate insulating film 1106 to fill the upper portions of the first type gate trenches 1103, and then etched back by CMP (Chemical Mechanical Polishing) or Plasma Etch or Poly recess etch to serve as the single gate electrodes 1105.

In FIG. 11O, A-A' cross-sectional structure is shown, a second dielectric layer such as combination of an undoped oxide layer and a BPSG layer is formed over the entire structure using conventional techniques. After applying a contact mask (not shown) onto the top surface of the N epitaxial layer 1102, the oxide layer is etched back to form the dielectric layer 1121. After applying a contact mask (not shown) onto the contact interlayer 1121, a plurality of trenched contacts 1123 are formed by successively dry oxide etch and dry silicon etch penetrating through the contact interlayer 1121, and extending into the p body regions 1110 for trenched source-body contacts. A Boron Ion Implantation is performed to form a p type gate oxide electric field reducing region 1118 (illustrated as Pr) adjoining lower surfaces of the p body region 1110 and space apart from the trenches 1103. Next, another BF2 Ion Implantation is performed to a p+ body contact doped region 1114 within the p body regions 1110 and surrounding at least bottom of the trenched source body-contacts penetrating through the n+ source region 1111 and extending into the p body region 1110, and Then, a barrier metal layer of Ti/TiN is deposited on sidewalls and bottoms of all the trenched contacts 1123 followed by a step of RTA process for silicide formation. Then, a tungsten material layer is deposited onto the barrier layer, wherein the tungsten material layer and the barrier layer are then etched back to form contact metal plug 1113 comprising Ti/TiN/W for the trenched source-body contacts. A metal layer of Al alloys padded by a resistance-reduction layer Ti or Ti/TiN underneath is deposited onto the contact interlayer 1121 and followed by a metal etching process by employing a metal mask (not shown) to be patterned as a source metal 1112.

Figure 11P:
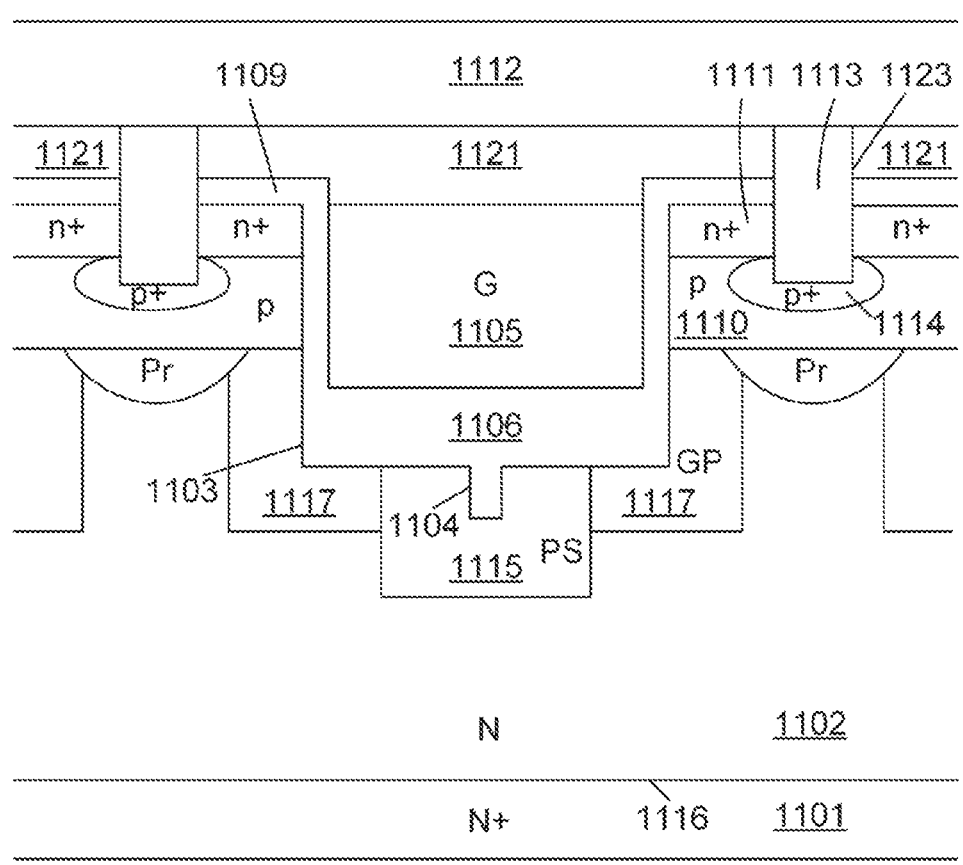

In FIG. 11P, B-B' cross-sectional structure is shown, a second dielectric layer such as combination of an undoped oxide layer and a BPSG layer is formed over the entire structure using conventional techniques. After applying a contact mask (not shown) onto the top surface of the N epitaxial layer 1102, the oxide layer is etched back to form the dielectric layer 1121. After applying a contact mask (not shown) onto the contact interlayer 1121, a plurality of trenched contacts 1123 are formed by successively dry oxide etch and dry silicon etch penetrating through the contact interlayer 1121, and extending into the p body regions 1110 for trenched source-body contacts. A Boron Ion Implantation is performed to form a p type gate oxide electric field reducing region 1118 (illustrated as Pr) adjoining lower surfaces of the p body region 1110 and space apart from the trenches 1103. Next, another BF2 Ion Implantation is performed to a p+ body contact doped region 1114 within the p body regions 1110 and surrounding at least bottom of the trenched source body-contacts penetrating through the n+ source region 1111 and extending into the p body region 1110, and Then, a barrier metal layer of Ti/TiN is deposited on sidewalls and bottoms of all the trenched contacts 1123 followed by a step of RTA process for silicide formation. Then, a tungsten material layer is deposited onto the barrier layer, wherein the tungsten material layer and the barrier layer are then etched back to form contact metal plug 1113 comprising Ti/TiN/W for the trenched source-body contacts. A metal layer of Al alloys padded by a resistance-reduction layer Ti or Ti/TiN underneath is deposited onto the contact interlayer 1121 and followed by a metal etching process by employing a metal mask (not shown) to be patterned as a source metal 1112.

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. A SiC power device comprising a plurality of unit cells with each unit cell in an active area comprising:
    an epitaxial layer of a first conductivity type onto a substrate;
    at least one stripe gate trench surrounded by a source region of said first conductivity type encompassed in a body region of a second conductivity type near a top surface of said epitaxial layer;
    said stripe gate trench having a first type gate trench and a second type gate trench; said first type gate trench is above said second type gate trench and has a trench width wider than a trench width of said second type gate trench;
    a gate electrode disposed in said first gate trench surrounded with a first insulating film on bottom of said first type gate trench, and with a second insulating film on sidewalls of said first type gate trench; said first insulating film having a thickness greater than a thickness of said second insulating film;
    a P-shield region of said second conductivity type for gate oxide electric-field reduction surrounding with said second type gate trench filled up with said first insulating film;
    at least one grounded P region of said second conductivity type surrounding sidewalls and bottom of said first type gate trench, connecting with said body region and said P-shield gate region; and
    said body region and said source region being shorted to a source metal through source contacts.

2. The SiC power device of claim 1, wherein said substrate has said first conductivity type.

3. The SiC power device of claim 1, wherein said substrate has said first conductivity type, said SiC power device further comprising a second P-shield region of said second type conductivity for gate oxide electric-filed reduction adjoining lower surface of said body region and space apart from said stripe gate trench.

4. The SiC power device of claim 1, further comprising a super junction structure comprising a P column region of said second type conductivity disposed above said substrate.

5. The SiC power device of claim 4, wherein said substrate has said first conductivity type and said epitaxial layer comprises a single epitaxial layer having uniform doping concentration.

6. The SiC power device of claim 4, wherein said substrate has said first conductivity type and said epitaxial layer comprises a single epitaxial layer having uniform doping concentration with resistivity R, said SiC power device further comprises a buffer layer of said first conductivity type with resistivity Rn sandwiched between said substrate and said epitaxial layer, wherein R>Rn.

7. The SiC power device of claim 4, wherein said substrate has said second conductivity type and said epitaxial layer comprises a single epitaxial layer having uniform doping concentration with resistivity R, said SiC power device further comprises a buffer layer of said first conductivity type with resistivity Rn sandwiched between said substrate and said epitaxial layer, wherein R>Rn.

8. The SiC power device of claim 4, wherein said substrate has said second conductivity type, further comprises: a buffer layer of said first conductivity type formed sandwiched between said substrate and said epitaxial layer; a plurality of heavily doped regions of said first conductivity type in said substrate to form a plurality of alternating P+ and N+ regions in said substrate.

9. The SiC power device of claim 1 further comprises a current spreading region of said first conductivity type surrounding at least sidewalls of said first type gate trench in said active area without having said grounded P region, wherein said current spreading layer has a higher doping concentration than a doping concentration of said epitaxial layer.

10. The SiC power device of claim 4, wherein said P column region of said super junction structure is formed by multiple epi method.

11. The SiC power device of claim 4, wherein said P column region of said super junction structure is formed by opening a deep trench filled up with an epitaxial layer of said second conductivity type.

* * * * *